United States Patent [19]
Sizmur et al.
[11] 4,147,993
[45] Apr. 3, 1979

[54] ELECTRICAL SIGNAL GENERATORS

[75] Inventors: Malcolm F. Sizmur, Ottershaw; David Brewerton, Bracknell; Brian W. Mason, Birmingham, all of England

[73] Assignee: Racal-Dana Instruments Limited, England

[21] Appl. No.: 855,300

[22] Filed: Nov. 28, 1977

Related U.S. Application Data

[63] Continuation of Ser. No. 707,958, Jul. 23, 1976, abandoned.

[30] Foreign Application Priority Data

Dec. 9, 1975 [GB] United Kingdom ............... 50379/75

[51] Int. Cl.² ............................................ H03B 3/08
[52] U.S. Cl. ...................................... 331/1 A; 331/16
[58] Field of Search .................... 331/1 A, 1 R, 2, 16, 331/18; 328/155

[56] References Cited

U.S. PATENT DOCUMENTS

| | | | |
|---|---|---|---|
| 3,657,664 | 4/1972 | Brack | 331/1 A |
| 3,689,849 | 9/1972 | Swanson et al. | 331/1 A |
| 3,815,042 | 6/1974 | Maunsell et al. | 331/1 A |
| 3,949,305 | 4/1976 | McClaskey | 331/1 A |
| 3,959,737 | 5/1976 | Tanis | 331/1 A |

*Primary Examiner*—John Kominski
*Attorney, Agent, or Firm*—Leydig, Voit, Osann, Mayer & Holt, Ltd.

[57] ABSTRACT

An electrical signal generator for generating signals at specific frequencies includes means for producing an adjustable frequency output, adjusting means for causing changes in the output frequency, and control means for adjustably pre-selecting the sizes of the frequency changes. In this way, the operator can be provided with a frequency changing control which, when operated, causes the output frequency to change in predetermined steps.

11 Claims, 3 Drawing Figures

RANGE SWITCH
82
B
A
DISPLAY
146
COUNTER
144
÷ 2
142
TIME BASE
140
148
120 MHz
14
÷ 24
16
22
÷100
24
26
PHASE DETECTOR
12
5 MHz
10
FILTER
18
20
SELECTOR
152
TUNING
153
VCO
149
150
PROGRAMMABLE DIVIDER
42
PHASE DETECTOR
34
SCALE DIVIDER
32
÷ 8
31
SELECTOR
28
30
FILTER
47
46
STEP SIZE SWITCH
160
ARITHMETIC MEANS
44

ELECTRICAL SIGNAL GENERATORS

RELATED APPLICATION

This application is a continuation of application Ser. No. 707,958 filed July 23, 1976, and now abandoned.

BACKGROUND OF THE INVENTION

The invention relates to electrical signal generators for generating signals at specific frequencies.

Electrical signal generators are widely used in the electrical and electronics industry for generating electrical signals at various frequencies, mainly for the purposes of testing telecommunications and other equipment. In its basic form, such a signal generator in the prior art may comprise an adjustable frequency source, which may for example be an adjustable oscillator or an adjustable frequency synthesizing system, together with a control by which an operator can adjust the frequency. In addition, such a signal generator may have some form of indicator to indicate the actual frequency of the generated signal. Such an indicator may, for example, be driven from a counter which counts the frequency of the generated signal. Therefore, to cause a required change in generated frequency, the operator operates the control until the indicator indicates the new frequency.

Such signal generators find very wide use in industry. However, in certain applications they are not entirely satisfactory because it is time-consuming for an operator to reset such a signal generator to a new, desired, frequency, and, in testing telecommunications equipment for example, it may be necessary for the operator to repeatedly have to reset the generated frequency to different values in order to test the equipment throughout its operating ranges.

It is therefore an object of the invention to provide an improved electrical signal generator.

A more specific object of the invention is to provide an electrical signal generator having an improved facility for adjusting its output frequency.

BRIEF SUMMARY OF THE INVENTION

According to the invention, there is provided an electrical signal generator, comprising controllable oscillator means for producing a controlled frequency, switchable dividing means connected to the oscillator means for dividing the controlled frequency to produce an output frequency, range adjusting means connected to the switchable dividing means for switching the switchable dividing means to select a predetermined range for said output frequency, step size control means for pre-selecting a desired size of incremental change in the output frequency, initiating means operable by an operator for initiating incremental changes in output frequency, and arithmetic means responsive to the step size control means and the range adjusting means and activated by operation of the initiating means for controlling the controllable oscillator output frequency in increments determined by the step size control means.

BRIEF DESCRIPTION OF THE DRAWINGS

A signal generator embodying the invention will now be described, by way of example only, with reference to the accompanying drawings in which.

DESCRIPTION OF PREFERRED EMBODIMENTS

Figure 1A:
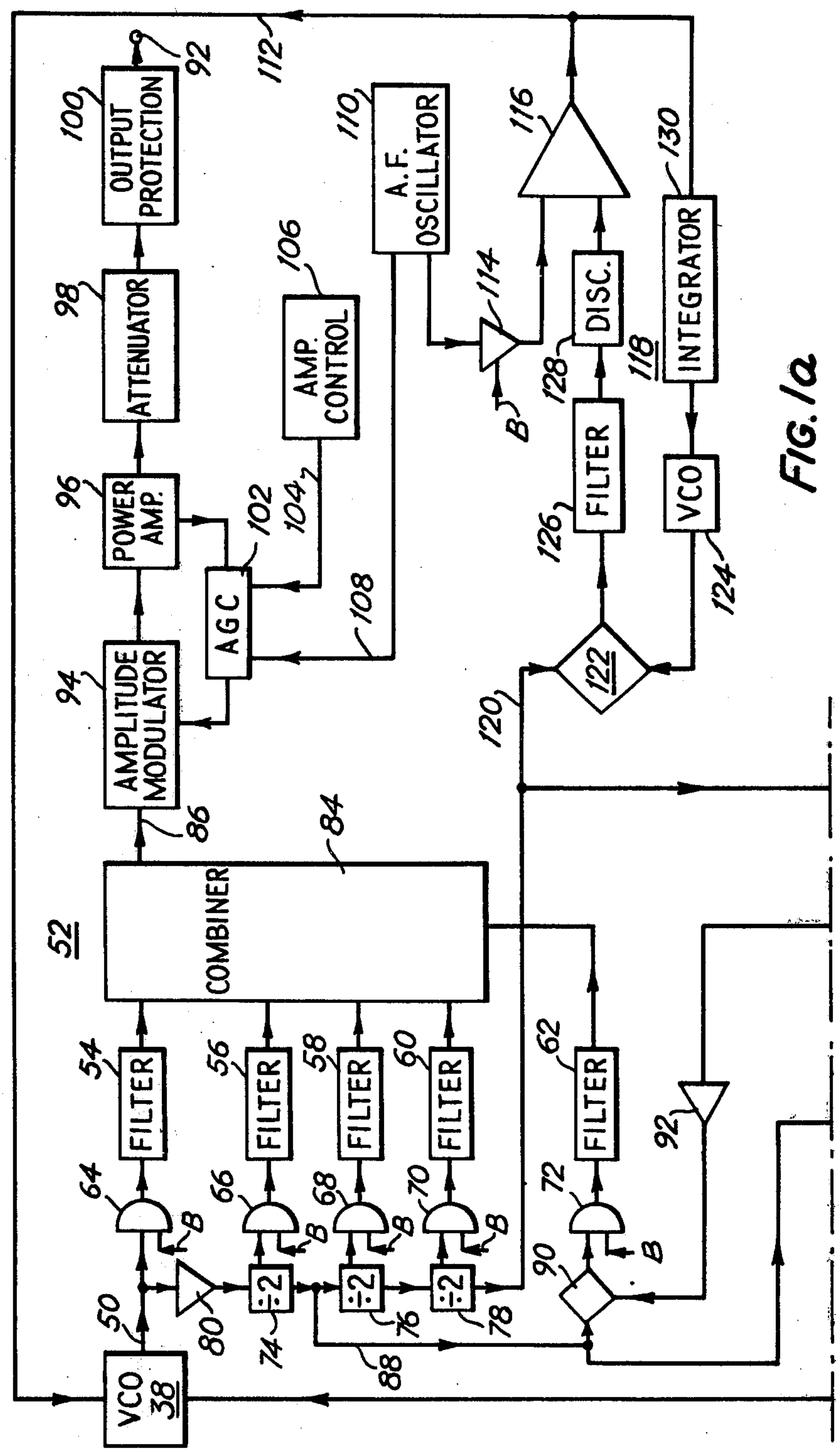
FIGS. 1*a* and 1*b* are block circuit diagrams of the signal generator.
Figure 1B:
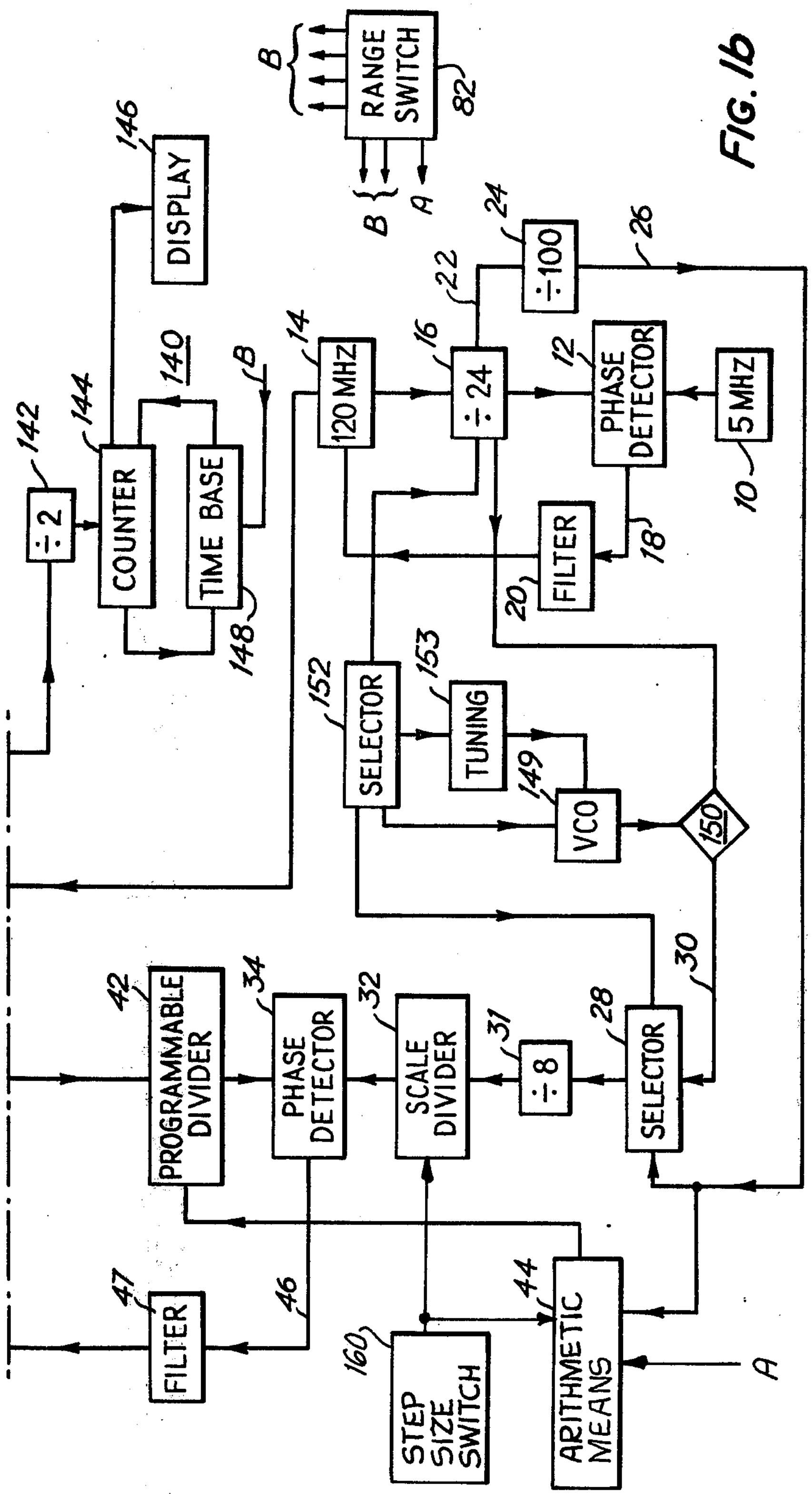

Referring to FIG. 1, the signal generator to be described can be set by an operator, using a range switch, to produce an output frequency which lies within a selected one of a series of frequency ranges; say, 5 to 32 MHz; 32 to 64 MHz; 64 to 128 MHz; 128 to 286 MHz; and 256 to 512 MHz. A second control can be set to define the size of the frequency increments by which the frequency can be advanced through the selected range; this control is called the "step-size" switch. The step-size switch can be set, for example, to select a frequency increment or step size of, say, 5 kHz, 6.25 kHz, 10 kHz, 12.5 kHz, 15 kHz, 20 kHz, 25 kHz, 30 kHz, 50 kHz or 60 kHz. In other words, the selectable step sizes correspond to standard communication channel spacings so that at least some of the actual frequency settings obtained will correspond to actual frequency channels. The step sizes are arranged in octave groups, that is 5 kHz, 10 kHz, and 20 kHz (Group 1), 6.25 kHz, 12.5 kHz and 25 kHz (Group 2), and 15 kHz, 30 kHz and 60 kHz (Group 3).

In addition, there is a frequency changing control which is operable by the operator to increase or decrease the output frequency. When this control is operated, the frequency alters (within the pre-selected range) in steps which are defined by the frequency increment or step-size selected on the step-size switch. The circuit to be described is thus arranged to ensure that the frequency automatically changes by the required amounts.

As shown in FIG. 1, the signal generator is controlled by a 5 MHz stable reference oscillator 10. The output of this oscillator is fed into a phase detector 12 where its phase is compared with the phase of the output of a controllable 120 MHz oscillator 14 whose output is fed to a second input of the phase detector 12 through a divide-by-24 divider 16. Any phase difference detected by the phase detector 12 produces a control signal on a line 18 which re-adjusts the oscillator 14 via a loop filter 20, in a direction tending to reduce the difference to zero. The frequency of the oscillator 14 is therefore controlled accurately at 120 MHz, and a 30 MHz output is taken from the divider 16 on a line 22 and fed through a divide-by-100 divider 24 to provide a 300 kHz reference frequency on a line 26.

Line 26 is connected to one input of a reference selector switch 28 which also receives a second reference frequency, whose derivation will be described below, on a line 30. It will be assumed initially that the reference selector 28 is set to select the 300 kHz reference on line 26, and this is fed through a divide-by-8 divider 31 and a scale divider 32 to a phase detector 34. The divider 32 is settable to have a division factor of 10, 12 or 15 and the signal at the output of the divider therefore has a value of 2.5, 3.125 or 3.75 kHz.

The second input to the phase detector 34 is derived from a voltage controlled oscillator (VCO) 38 via a circuit which includes a divider 42 whose division factor is programmable to any desired one of a selected range of integral values by means of frequency selection logic or arithmetic means 44 to be described in more detail below.

The phase detector 34 responds to any phase difference between its two inputs by producing a corresponding control signal on a line 46 which adjusts the frequency of the VCO 38 to reduce the phase difference towards zero via a loop filter 47. Therefore, the output frequency of the VCO, on a line 50, is dependent on the settings of the dividers 32 and 42.

The output of the VCO 38 on the line 50 is fed to output circuitry 52 which includes filters 54, 56, 58, 60 and 62, control gates 64, 66, 68, 70 and 72, and divide-by-2 dividers 74, 76 and 78. The oscillator output on the line 50 is fed to the chain of dividers 74, 76, 78 through a buffer amplifier 80.

The gates 64 to 72 have respective control lines B which are energized by a range switch 82 of the signal generator. Therefore, in dependence on the particular range in which the output is desired to lie, as selected by the operator on the switch 82 (in a manner to be described in more detail below), one or other of the gates 64 to 72 is enabled, whereupon the output of the VCO 38 is fed through the appropriate filter to a combining unit 84 and thence to a line 86. The range switch 82 also controls the arithmetic means 44 via a control line A.

It will be noted that the input to the control gate 72 is derived from the output of the divider 74 via a line 88 which feeds one input of a mixer 90. The other input of the mixer 90 is fed through a buffer amplifier 92 from the 120 MHz oscillator 14. In this way, a suitably low frequency is selected.

The divider 42 is also fed from the line 88, and therefore the divide-by-2 divider 74 is in the phase-lock loop of the VCO 38.

The selected output frequency on the line 86 is fed to the instrument output terminal 92 via an amplitude modulator unit 94, a power amplifier 96, an adjustable attenuator 98, and output protection circuitry 100. An AGC loop is provided via an AGC circuit 102, and a control line 104 to this unit enables the output level to be finely adjusted by means of a control 106. A second input to the AGC circuit 102 is fed via a line 108 from an audio-frequency oscillator and modulation control 110 which is controllable by the operator and thus, via the modulator 94, controllably applies any desired amount of amplitude modulation to the output.

The output can also be frequency-modulated as desired by the operator, by applying the output of the control 110 to modulate the output of the VCO 38 via a line 112. The output of the control 110 is applied to the line 112 through a variable gain amplifier 114 whose gain is controlled in dependence on the setting of the range switch 82, and via a summing amplifier 116.

The second input of the summing amplifier 116 forms part of a loop 118 whose purpose is merely to linearize the response of the VCO 38 to the frequency modulation signal. The loop 118 is energized via a line 120 from the divide-by-2 divider 78. This signal is mixed in a mixer 122 with the output of a VCO 124. The mixer output is band-pass filtered by a filter 126 and the resultant signal is fed to the summing amplifier 116 via a discriminator 128. The VCO 124 is controlled in frequency via an integrator 130 which responds to the output of the summing amplifier 116.

The signal generator includes display circuitry 140 for digitally displaying the frequency existing at the output terminal 92. The display circuitry is driven from the line 120 via a divide-by-2 divider 142 and incorporates a frequency counter 144 whose output is displayed on a digital display unit 146. In order to take account of the effect of range changes on the output frequency, the counter has its time base controlled by a time base divider 148 which is connected to the range change switch 82.

Although, as explained briefly above and to be explained in more detail below, the signal generator is arranged to step through a pre-selected frequency range in frequency increments of pre-selected size, it does also include circuitry to enable frequency interpolation between steps. This circuitry is provided by a voltage controlled oscillator 149 having a nominal output frequency of 5.3 MHz whose output is fed to one input of a mixer 150. The other input of the mixer receives a 5 MHz output from the divider 16, and the lower sideband output of the mixer 150 is therefore 300 kHz. This is applied by the line 30 as the second input to the selector 28. A selector switch 152 enables the operator to select whether the frequency interpolating circuitry is to be operative or whether it is to be non-operative—in the latter case, as explained, the frequency changes only in the pre-selected steps.

When the switch 152 renders the frequency interpolating circuitry operative, the reference selector 28 turns the oscillator 149 on and selects the input on its line 30 instead of line 26. In addition, a tuning control 153 is rendered operable for fine manual tuning of the output of the oscillator 149, with consequent fine control of the output frequency of the signal generator. If desired, an external voltage may be fed to the oscillator 149 to control its frequency.

When the switch 152 selects the frequency interpolating circuitry to be non-operative, the oscillator 149 is turned off.

The arithmetic circuitry for controlling the circuit of the signal generator so that its frequency advances in the pre-selected steps will now be described particularly with reference to FIG. 2.

Figure 2:
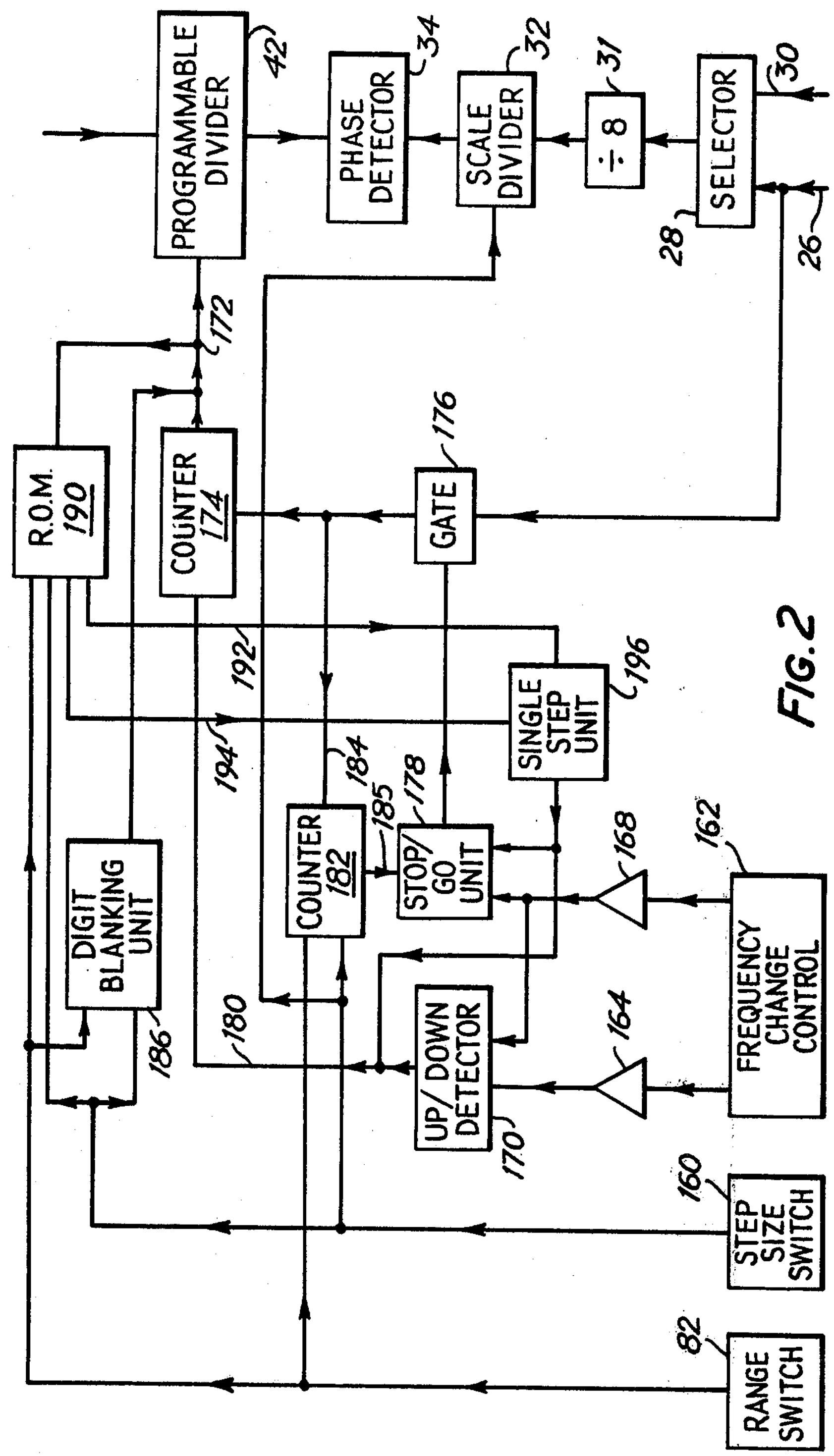
FIG. 2 is a block circuit diagram showing logic or arithmetic circuitry of the signal generator in more detail.

FIG. 2 shows the main loop divider 42 and other parts of the main phase-lock loop of the signal generator. Also shown in FIG. 2 is the range switch 82, previously referred to, (which enables the operator to select the frequency range through which frequency stepping is to take place), the step-size switch 160 (which enables the operator to define the sizes of the steps in which the frequency changes), and the frequency change control 162 (which is operated to cause changes in frequency in the predetermined frequency steps). In this example, the frequency change control 162 comprises a rotatable wheel which drives a pulse generating unit. For example, the wheel may drive a rotatable digitising disc carrying a plurality of visually sensible marks which interact with photocell means to produce the pulses. There are in fact two photocells provided which are spaced such as to give 90° phase difference between their respective output pulses which are shaped and amplified in respective triggering units 164 and 168. The shaped pulses then pass into an up/down detector 170 which, by comparing the relative phases of the pulses, determines the direction of rotation of the control 162 (that is, whether the operator is calling for an increase or decrease in the frequency).

The step-size switch 160 is connected to control the division factor of the scale divider 32, and it sets this division factor in direct dependence on the selected octave grouping of step sizes, that is, it sets the division factor to one value if the set step size is 5 kHz, 10 kHz or 20 kHz, to another value if the set step size is 6.25 kHz, 12.5 kHz or 25 kHz, and to a further value if the set step size is 15 kHz, 30 kHz or 60 kHz. As the divider 32 affects the phase-lock loop of the VCO 38, adjustment of its division factor correspondingly alters the frequency of the VCO.

The main control of the VCO frequency is, however, exerted by the adjustable loop divider 42. This divider is a programmable divider whose division factor is settable to any integral value (over a predetermined range) by means of a digital control signal fed to the divider on a channel 172. The channel 172 is set by a digital counter 174, and it is thus the state of the counter which determines the division factor of the divider 42. The setting of the counter is controlled in a manner to be explained.

Count pulses for counter 174 are fed into the counter through a gate 176. This is driven by pulses at a fixed frequency of 300 kHz which are derived from line 26 (FIG. 1). The gate is opened and closed by a stop/go unit 178. The control unit 178 receives the pulses which are produced by the triggering unit 168 in response to rotation of the frequency change control 162. Each of these pulses switches the control unit 178 so that it opens the gate 176. Pulses at the frequency of 300 kHz are thus fed into the counter 174. The up/down detector 170 determines whether the control 162 is demanding an increase or a decrease in frequency and sets the counter 174 to count up or down accordingly, by means of a line 180.

The closure of the gate 176 is controlled by a control counter 182 through the stop/go unit 178. The counter 182 is connected to the range switch 82 and the step-size switch 160 so as to be set by those switches to a predetermined count whose value depends on the respective settings of the switches. When the gate 176 is opened by the unit 178, in response to movement of the control 162, the pulses passing through the gate not only count the counter 174 but are also fed into the counter 182 by means of a line 184. When they have counted the counter 182 to zero from its initial setting (determined, as explained, by the range and step-size switches), the counter produces a signal on a line 185 which causes the unit 178 to close the gate 176.

In this way, the count in the counter 174 is set to a value which is dependent on the settings of the range switch 82 and the step-size switch 160, and the divider 42 is adjusted accordingly.

It is necessary to modify the operation of the counter 174 to deal with the fact that a change of range (by means of the range switch 82) cannot be satisfied simply by a proportionate change in the division factor of the divider 42; this is because of the need to ensure that the step changes in frequency (obtained by operating the control 162) are in agreement with the standard communication channels. If, for example, the instrument is operating on a certain range with a certain frequency step size, it follows that the actual frequency will be separated from a frequency datum in that range by an integral multiple of the step size. If there is then a range change, halving the frequency for example, it does not follow that the new frequency will be separated from the corresponding frequency datum in the new frequency range by an integral multiple of the step size. In order to deal with this problem, the counter 174 is connected to a digit blanking unit 186 which is able to control the binary states of the digit lines representing the the least significant digits in the channel 172. The unit 186 is connected to respond to the range switch 82 and the step size switch 160, and as the range called for is reduced, it progressively locks the binary states of more of the digit lines. In this way, a demanded range change produces an incremental change in the count of the counter 174 as well as the larger change required by the range change. The incremental change (produced by the locking of the digit lines) ensures that, in the new range, the actual output frequency will be synchronized with a standard communication channel.

The digit blanking unit 186 may comprise a series of switches controlled through logic by the range change switch 82 and the step size switch 160 to ensure that the correct digit lines are locked as the frequency range is changed.

Therefore, for every combination of settings of the range switch 82 and the step-size switch 160, the step changes in division factor of the divider 42, which occur in response to movement of the frequency change control 162, are such that the output frequency of the signal generator 92 changes by the selected frequency increment. In addition, of course, the setting of the range switch 82 selects the appropriate one of the gates 64 to 72 (FIG. 1) to select the appropriate range of the output frequency.

In order the prevent the system from so altering the count in the counter 174 (and thus the division factor of the divider 42) that the frequency of the VCO 38 becomes outside its normal control range, a read-only memory (ROM) 190 is provided. The ROM is connected to receive outputs from the counter 174 indicative of the states of the latter's more significant stages, and these outputs therefore correspond to settings of the divider 42 which the counter is attempting to impose. The ROM 190 also receives inputs indicative of the step size selected by the step size switch 160 (since the step size affects the division factor of the divider 40 and thus also affects the frequency of the VCO 38). The ROM 190 stores information relating to the permitted limiting division factors of the divider 42 for each possible step size and, in conjunction with additional circuitry responsive to the information from the step size switch 160, the ROM 190 produces a first output, on a line 192, indicating whether the division factor (of the divider 42) called for by the counter 174 brings the frequency of the VCO 38 outside its range, and a second output, on a line 194, indicating whether it is the upper or lower limit of the VCO frequency range which is being breached. These signals are fed to a single step unit 196 which continually steps the counter 174 in the appropriate direction until it is in range.

The single step unit 196 can also be operated by a front panel switch to enable the operator to change the frequency by one frequency step when required.

If desired, the output pulses produced by the frequency change control 162 can be output through a switchable divider. In this way, the rate of change of frequency stepping, for a given speed of movement of the control 162, can be altered by switching the divider in or out of circuit or varying its division factor. When the system is set to produce a high rate of frequency stepping (for a given speed of movement of the control 162), it is advantageously arranged so that the actual frequency step size increases to the maximum in the particular range—for example, if the set step size is 5 kHz, the system would automatically advance to steps of 40 kHz in the "fast" setting of the rate of frequency stepping.

It will be appreciated that the frequency change switch 162 can take different forms from that shown.

Any other suitable method of generating control pulses may be used instead, for example. Changes may also be made to the logic circuitry shown for controlling the output frequency and its step sizes. For example, a programmed micro-processor may be used.

What is claimed is:

1. An electrical signal generator, comprising controllable oscillator means for producing a controlled frequency, switchable dividing means connected to the oscillator means for dividing the controlled frequency to produce an output frequency, range adjusting means connected to the switchable dividing means for switching the switchable dividing means to select a predetermined range for said output frequency, step size control means for pre-selecting a desired size of incremental change in the output frequency independent of the value of the output frequency, initiating means for initiating incremental changes in the output frequency, and arithmetic means responsive to the step size control means and the range adjusting means and activated by operation of the initiating means for controlling the controllable oscillator to alter said output frequency in increments determined by the step size control means.

2. A signal generator according to claim 1, including a phase comparator, a source of reference frequency, two connecting means respectively connecting the adjustable oscillator means and the source of reference frequency to respective inputs of the phase comparator whereby the latter produces an output signal dependent on the phase difference between the two frequencies compared, at least one said connecting means including an adjustable frequency divider, and means feeding the output signal of the phase comparator to the controllable oscillator means to adjust the frequency produced thereby in a direction tending to reduce the output signal of the phase comparator to zero; and in which the arithmetic means includes means for adjusting the division factor of the adjustable divider thereby to alter the frequency produced by the controllable oscillator means.

3. A signal generator according to claim 1, including means connected to the arithmetic means and selectively operable for adjusting the output frequency by amounts other than the desired increments.

4. A signal generator according to claim 1, including means connected to receive the output frequency for adjustably modulating the output frequency.

5. A signal generator according to claim 2, in which the initiating means comprises a pulse source, frequency change control means for activating the pulse source to produce pulses for initiating said incremental changes in the output frequency and whose number is dependent on the number of said incremental changes desired, and the arithmetic means includes pulse-activated means connected to the range adjustment means, the step size control means and the pulse source and activated by said pulses for adjusting the division factor of the adjustable divider by an amount dependent on the setting of the switchable dividing means, said desired size of frequency increment and the number of said pulses produced.

6. A signal generator according to claim 5, in which the pulse-activated means comprises a first counter, a source of clock signals having a substantially higher frequency than the said pulses, a gate connected to controllably feed the clock signals to the first counter to be counted thereby, means responsive to each said pulse and connected to open the gate, a second counter connected to controllably receive the clock signals through said gate, means connecting the second counter to the range adjustment means and the step size control means to set up a count in the second counter dependent on the setting of the switchable dividing means and said desired size of incremental change in output frequency, means connected to the second counter to detect when the number of clock signals counted thereby becomes equal to the said count of the second counter and operative in response to such detection to close the said gate, and means feeding the count of the first counter at that time to the said one adjustable divider to set its division factor in dependence on that count of the first counter.

7. A signal generator according to claim 6, including memory means storing, for each size of incremental change in the output frequency, data representing upper and lower values for the division factor of the said one adjustable divider which correspond to the upper and lower limits of the frequency produced by the oscillator means, and comparing means responsive to the size of each incremental change in the output frequency pre-selected by the control means to compare the actual resultant value of the division factor of the said one adjustable divider with the corresponding said upper and lower values thereof to produce a control signal if the actual value is outside the range set by the upper and lower values.

8. A signal generator according to claim 7, including means responsive to the control signal produced by the comparing means to modify the count of the first counter to bring the division factor to between the upper and lower values.

9. An electrical signal generator, comprising a phase comparator, adjustable oscillator means, a source of reference frequency, first and second adjustable frequency dividers respectively connecting the adjustable oscillator means and the source of reference frequency to the two inputs of the phase comparator whereby the latter produces an output signal dependent on the phase difference between the two frequencies compared, means feeding the output signal of the phase comparator to the adjustable oscillator means to adjust the frequency thereof in a direction tending to reduce the output signal of the phase comparator to zero, switchable dividing means connected to the oscillator means to divide the frequency thereof and thereby produce an output frequency, range adjustment means connected to the switchable dividing means and selectively operable to switch the switchable dividing means to have a particular division factor in dependence on the desired range of values of the said output frequency, step size control means selectively operable to adjustably pre-select a desired size of incremental change in the output frequency, initiating means operable by an operator to initiate incremental changes in the output frequency, and arithmetic means connected to the control means, the initiating means, the range adjustment means and the said second frequency divider for so altering the division factor thereof in relation to the setting of the switchable dividing means that the resultant changes in the frequency produced by the adjustable oscillator means cause the output frequency to alter in increments each having the said desired size.

10. An electric signal generator comprising controllable oscillator means for producing a controlled frequency, switchable dividing means connected to the oscillator means to divide said controlled frequency and thereby produce an output frequency, range adjusting means for setting the division factor of the switchable dividing means thereby to establish the range of said output frequency, step size switch means settable to select one of a plurality of predetermined frequency increments, step size control means connected to the step size switch and having circuit connections to the controllable oscillator for controlling the switching of said output frequency in increments, the size of which are determined by the step size switch means, and frequency change control means for activating the step size control means to alter said output frequency in said selected increments.

11. An electric signal generator comprising controllable oscillator means having a phase locked loop and a programmable divider for producing a controlled frequency, switchable dividing means connected to the oscillator means to divide said controlled frequency and thereby produce an output frequency, range adjusting means for setting the division factor of the switchable dividing means thereby to establish the range of said output frequency, step size switch means settable to select one of a plurality of predetermined frequency increments, step size control means connected to the step size switch and having circuit connections to said phase locked loop for programming said programmable divider to alter the division factor thereof in increments having a size determined by the step size switch, and frequency change control means for activating the step size control means to program the programmable divider, thereby to alter said output frequency in said selected increments.

* * * * *